United States Patent
Al et al.

(10) Patent No.: US 12,123,904 B2
(45) Date of Patent: Oct. 22, 2024

(54) ISOLATION RESISTANCE MONITORING FOR HIGH VOLTAGE SYSTEMS

(71) Applicant: Volvo Car Corporation, Gothenburg (SE)

(72) Inventors: Fatih Al, Gothenburg (SE); Torbjörn Larsson, Alingsås (SE)

(73) Assignee: Volvo Car Corporation, Gothenburg (SE)

( * ) Notice: Subject to any disclaimer, the term of this patent is extended or adjusted under 35 U.S.C. 154(b) by 278 days.

(21) Appl. No.: 17/653,666

(22) Filed: Mar. 7, 2022

(65) Prior Publication Data

US 2023/0280384 A1    Sep. 7, 2023

(51) Int. Cl.
| | | |
|---|---|---|
| *G01R 31/00* | (2006.01) | |
| *B60L 53/60* | (2019.01) | |
| *G01R 27/02* | (2006.01) | |
| *G01R 31/52* | (2020.01) | |

(52) U.S. Cl.
CPC ............ *G01R 31/006* (2013.01); *B60L 53/60* (2019.02); *G01R 27/02* (2013.01); *G01R 27/025* (2013.01); *G01R 31/52* (2020.01)

(58) Field of Classification Search
CPC .... G01R 31/006; G01R 27/02; G01R 27/025; G01R 31/52; B60L 53/60; Y02T 10/70; Y02T 10/7072; Y02T 90/12
See application file for complete search history.

(56) References Cited

U.S. PATENT DOCUMENTS

| | | |
|---|---|---|
| 7,453,232 B2 | 11/2008 | Furukawa |
| 9,063,179 B2 | 6/2015 | Bober |
| 9,696,384 B2 | 7/2017 | Wang et al. |
| 9,720,049 B2 | 8/2017 | Anzicek |
| 10,632,855 B2 | 4/2020 | Comesana |
| 2013/0300430 A1 | 11/2013 | Lindsay et al. |
| 2014/0058687 A1* | 2/2014 | Wang ................ G01R 31/3842 702/51 |
| 2014/0084934 A1* | 3/2014 | Bober .................. G01R 27/025 324/434 |
| 2016/0200196 A1* | 7/2016 | Michaelides ........... B60L 50/16 701/22 |

(Continued)

FOREIGN PATENT DOCUMENTS

| | | |
|---|---|---|
| CN | 105109361 A | 12/2015 |
| CN | 113715663 A | 11/2021 |

(Continued)

OTHER PUBLICATIONS

Extended European Search Report received for European Patent Application Serial No. 23160557.7 dated Jul. 24, 2023, 13 pages.

*Primary Examiner* — Raul J Rios Russo (74) *Attorney, Agent, or Firm* — Amin, Turocy & Watson, LLP (57) ABSTRACT

Electrical circuits, systems, methods, and/or computer program products that can facilitate isolation resistance monitoring for high voltage buses are addressed. In one example, a system can comprise an electrical circuit further comprising one or more resistors and a voltage meter which measures voltage, such that the voltage measurement assists with monitoring isolation resistance, simultaneously, for a smartcell system of an electric vehicle, and for a direct current (DC) charging source external to the electric vehicle.

20 Claims, 7 Drawing Sheets

(56) References Cited

U.S. PATENT DOCUMENTS

| | | |
|---|---|---|
| 2020/0156477 A1 | 5/2020 | Hansen |
| 2021/0041505 A1* | 2/2021 | Fan ................... G01R 31/3648 |
| 2021/0129675 A1 | 5/2021 | Isaksson |
| 2021/0293896 A1 | 9/2021 | Kubokawa et al. |
| 2022/0260680 A1* | 8/2022 | Tsai ....................... G01S 7/4915 |
| 2024/0109448 A1* | 4/2024 | Vij ......................... G01R 31/52 |

FOREIGN PATENT DOCUMENTS

| | | |
|---|---|---|
| CN | 114076878 A | 2/2022 |
| JP | 6772720 B2 | 10/2020 |
| KR | 101512395 B1 | 4/2015 |

* cited by examiner

Monitoring, by an isolation resistance monitoring system, isolation resistance, simultaneously, for a smartcell system of an electric vehicle, and for a DC charging source external to the electric vehicle, wherein a voltage meter measures voltage to assist with the isolation resistance monitoring  502

ISOLATION RESISTANCE MONITORING FOR HIGH VOLTAGE SYSTEMS

BACKGROUND

One or more embodiments herein relate to electrical circuits, and more specifically, to systems, methods, and/or computer program products that can facilitate isolation resistance monitoring for high voltage systems.

SUMMARY

The following presents a summary to provide a basic understanding of one or more embodiments described herein. This summary is not intended to identify key or critical elements, or to delineate any scope of the particular embodiments and/or any scope of the claims. The sole purpose of the summary is to present concepts in a simplified form as a prelude to the more detailed description that is presented later. In one or more embodiments described herein, systems and/or methods are described that can facilitate isolation resistance monitoring for high voltage systems.

An embodiment includes an isolation resistance monitoring system comprising an electrical circuit. The electrical circuit further comprises one or more resistors and a voltage meter which measures voltage, such that the voltage measurement assists with monitoring isolation resistance, simultaneously, for a smartcell system of an electric vehicle, and for a direct current (DC) charging source external to the electric vehicle.

Another embodiment includes an isolation resistance monitoring method. The isolation resistance monitoring method comprises monitoring, by an isolation resistance monitoring system, isolation resistance, simultaneously, for a smartcell system of an electric vehicle, and for a DC charging source external to the electric vehicle.

Another embodiment includes an isolation fault detection method. The isolation fault detection method comprises detecting, by an isolation resistance monitoring system, an isolation fault in a smartcell system, wherein one or more contactors of the smartcell system are configured to design an isolation test for detecting the isolation fault.

DESCRIPTION OF THE DRAWINGS

One or more exemplary embodiments are described below in the Detailed Description section with reference to the following drawings.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

The principal challenge addressed by the invention is that it can provide a system for simultaneously monitoring isolation resistance of two isolated high voltage systems, galvanically connected to one another, wherein one high voltage system can be the smartcell system of an electric vehicle and the other high voltage system can be an external DC charging source for the electric vehicle. The isolation resistance monitoring system can also detect isolation fault in different areas of the smartcell system, which can further assist with providing good drivability for the electric vehicle, even when an isolation fault can be present.

Figure 1:
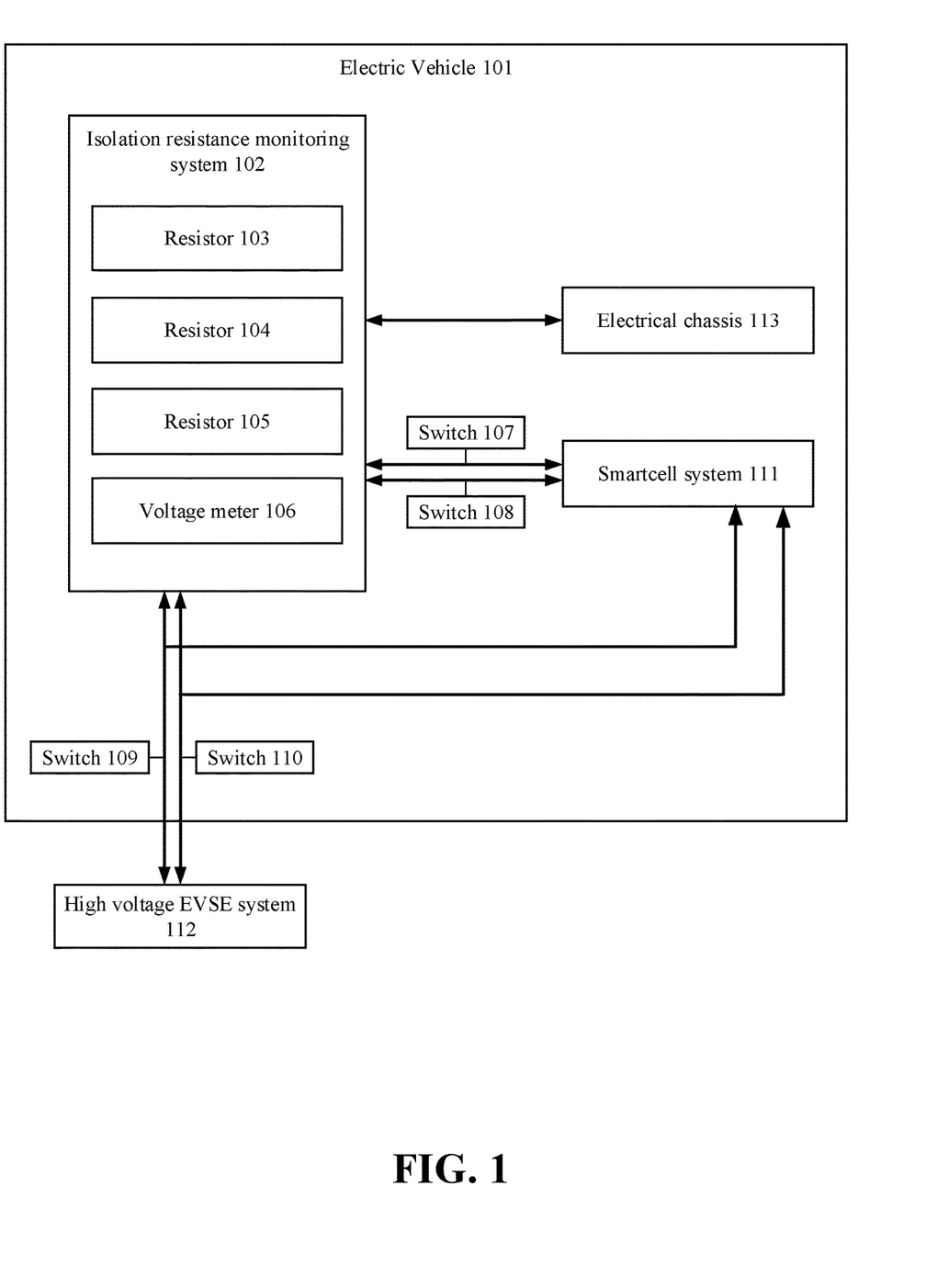
FIG. 1 illustrates a block diagram of an isolation resistance monitoring system integrated with two high voltage systems, in accordance with one or more embodiments described herein.

FIG. 1 illustrates a block diagram of an isolation resistance monitoring system integrated with two high voltage systems, in accordance with one or more embodiments described herein. The block diagram comprises electric vehicle 101, isolation resistance monitoring system 102, resistors 103-105, voltage meter 106, switches 107-110, smartcell system 111, high voltage EVSE system 112 and electrical chassis 113.

In an embodiment, electric vehicle 101 can comprise an isolation resistance monitoring system 102. Isolation resistance monitoring system 102 can be an electrical circuit comprising resistors 103, 104, and 105, and voltage meter 106. The isolation resistance monitoring system can monitor isolation resistance between the smartcell system 111 and the electrical chassis 113 of electric vehicle 101, and it can simultaneously monitor isolation resistance between the high voltage Electric Vehicle Supply Equipment (EVSE) system and the electrical chassis 113, wherein the EVSE system is an external DC charging station for electric vehicle 101. Isolation resistance monitoring system 102 can be electrically integrated with the smartcell system 111 via switches 107 and 108, wherein switches 107 and 108 can be respectively connected to each of the high voltage terminals of a high voltage bus of the smartcell system 111. In a similar manner, isolation resistance monitoring system 102 can be electrically integrated with the high voltage EVSE system 112 via switches 109 and 110. Switches 109 and 110 can further provide a connection between the isolation resistance monitoring system 102 and the electrical circuit of the smartcell system 111, and they can allow the isolation resistance monitoring system to simultaneously monitor isolation resistance for the smartcell system and the high voltage EVSE system, during DC charging of electric vehicle 101. Isolation resistance monitoring system 102 can be integrated with the electrical chassis 113 of the electric vehicle 101, wherein the electrical chassis can be a reference point for the isolation resistance monitoring system 102.

Voltage meter 106 can measure voltage through the smartcell system 111 and through the high voltage EVSE system 112 to assist the isolation resistance monitoring system 102 to monitor isolation resistance. Switches 107, 108, 109 and 110 can further assist the isolation resistance monitoring system 102 with measuring isolation resistance for electric vehicle 101. Isolation resistance monitoring system 102 can be controlled by a software and it can be used to locate isolation fault in different areas of the smartcell system 111, including isolation faults in cable harnesses, busbars, fuses, and other high voltage components of the smartcell system 111.

Figure 2:
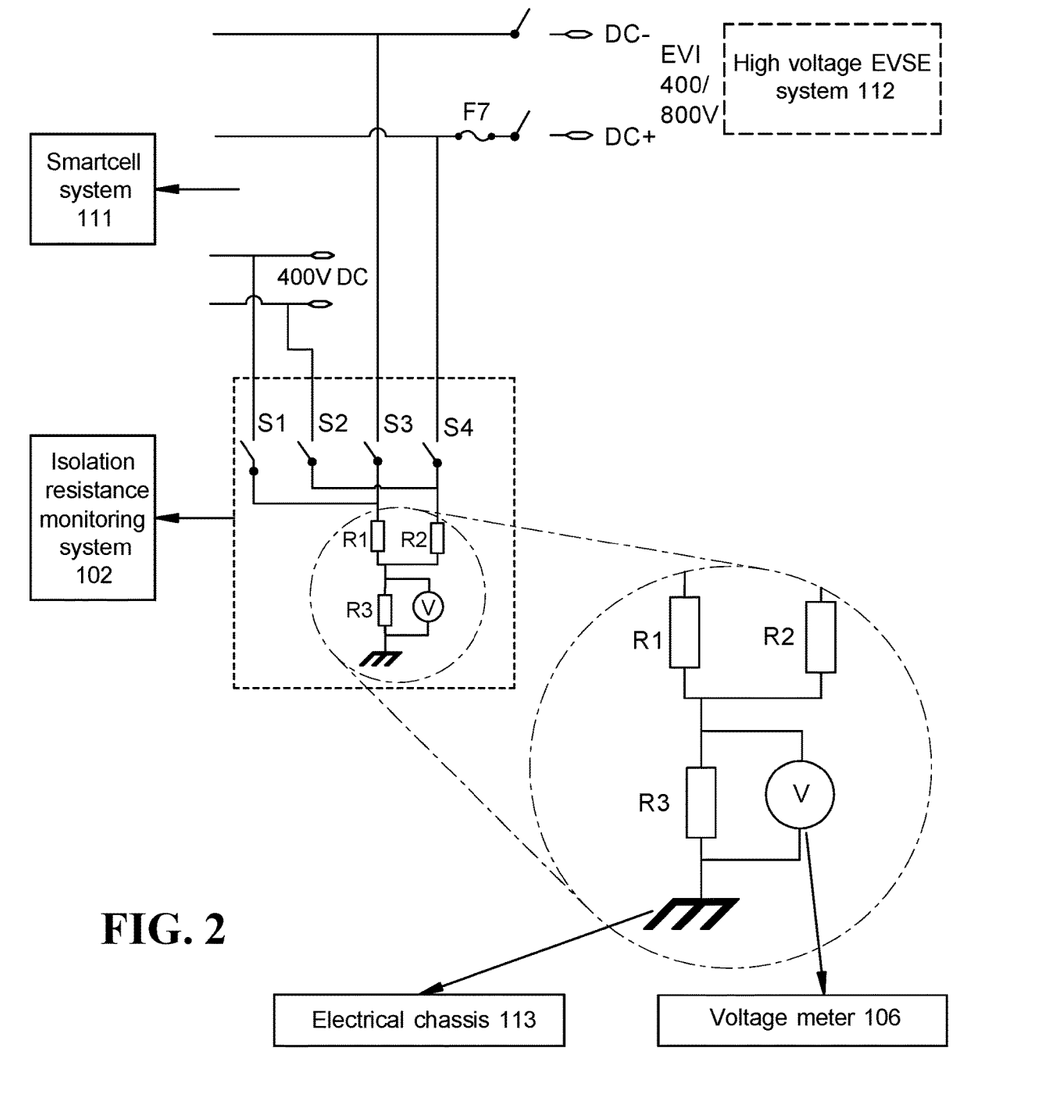
FIG. 2 illustrates the architecture of the isolation resistance monitoring system, in accordance with one or more embodiments described herein.

FIG. 2 illustrates the architecture of the isolation resistance monitoring system, in accordance with one or more embodiments described herein. FIG. 2 comprises isolation resistance monitoring system 102, resistors 103-105, voltage meter 106, smartcell system 111, high voltage EVSE system 112, electrical chassis 113, and switches 107-110 of FIG. 1, wherein resistors 103, 104 and 105 are respectively represented as R1, R2 and R3, and switches 107, 108, 109 and 110 are respectively represented as S1, S2, S3 and S4.

In an embodiment, resistor R3 can be connected in parallel with voltage meter 106. Resistors R1 and R2 can be connected in parallel with one another, and the parallel combination of resistor R3 and voltage meter 106 can be in series connection with the parallel combination of resistors R1 and R2. Switch 51 can be in series with resistor R1 and switch S2 can be in series with resistor R2 such that the isolation resistance monitoring system 102 can be galvanically connected with a high voltage bus of the smartcell system 111 via switches S1 and S2. The high voltage bus can be in parallel combination with one or more high voltage buses of smartcell system 111. Similarly, switch S3 can be in series with resistor R1 and switch S4 can be in series with resistor R2 such that the isolation resistance monitoring system 102 can be galvanically connected with the smartcell system 111, and with high voltage EVSE system 112, wherein the high voltage EVSE system can be an external DC charging station, as discussed in one or more embodiments herein.

For measuring isolation resistance, switches S1, S2, S3 and S4 can be operated consecutively. Initially, all switches can be in the open position, switch S1 can be closed and the voltage through the circuit can be measured using the voltage meter 106, switch S1 can be opened, and the procedure can be repeated for switch S2 to measure isolation resistance for the parallel combination of high voltage buses of smartcell system. The procedure of consecutively opening and closing the plurality of switches can be repeated for switches S3 and S4 to measure isolation resistance for the smartcell system and for the high voltage EVSE system, wherein the smartcell system and the high voltage EVSE system are galvanically connected during DC charging.

Figure 3:
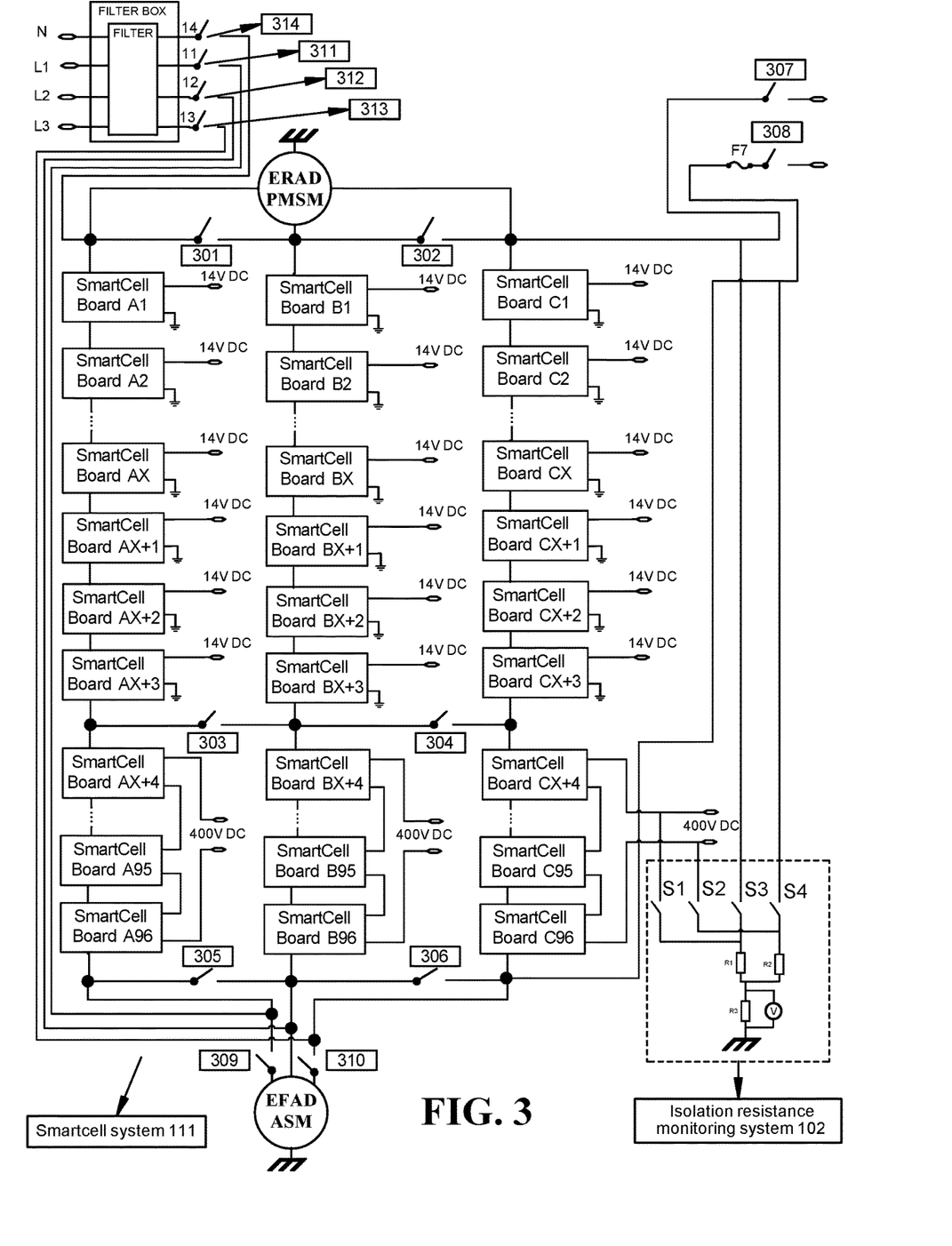
FIG. 3 illustrates the architecture of the isolation resistance monitoring system integrated with a smartcell system, in accordance with one or more embodiments described herein.
Figure 4:
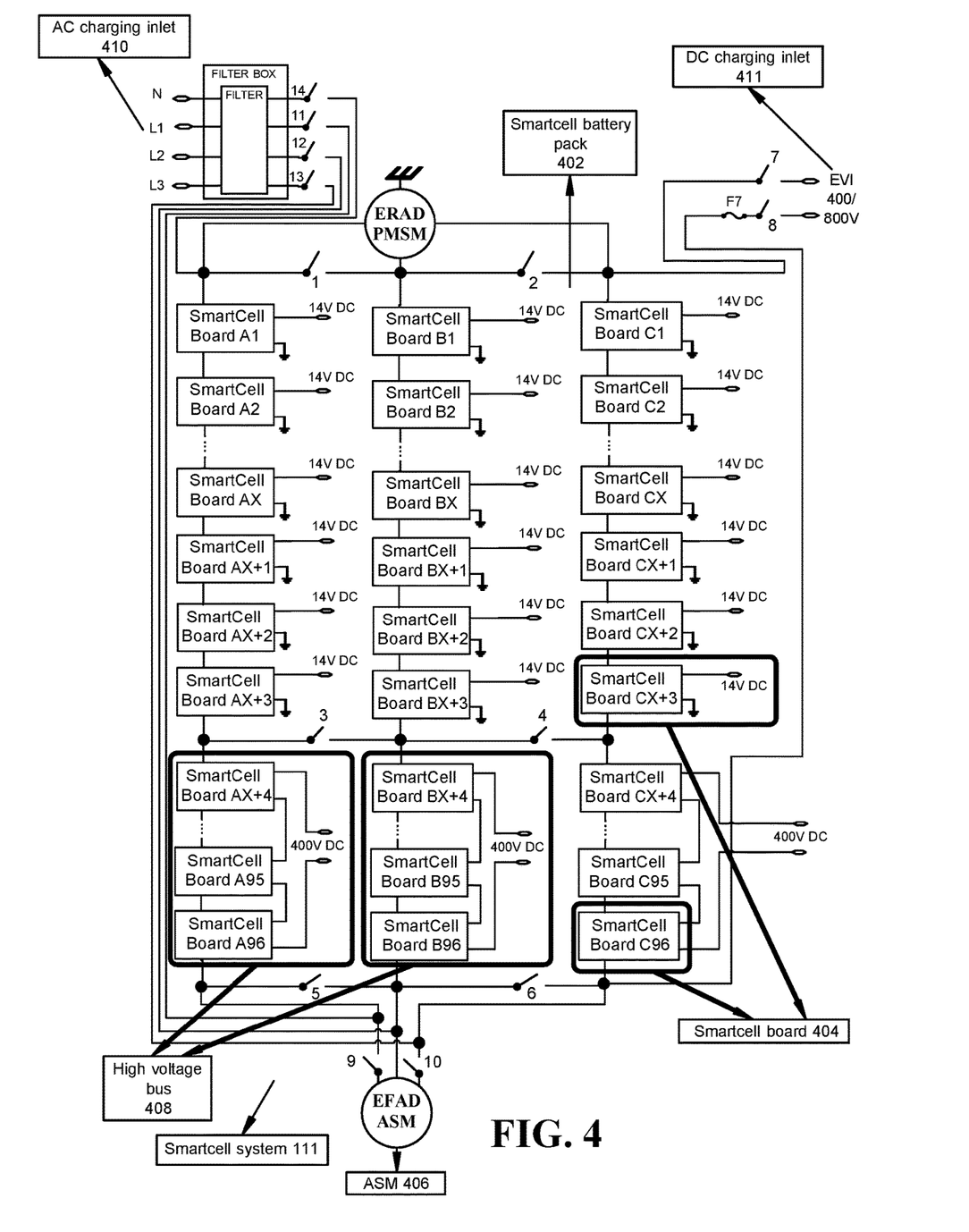
FIG. 4 illustrates the architecture of the smartcell system, in accordance with one or more embodiments described herein.

FIG. 3 illustrates the architecture of the isolation resistance monitoring system integrated with a smartcell system, in accordance with one or more embodiments described herein. FIG. 4 illustrates the architecture of the smartcell system, in accordance with one or more embodiments described herein. FIG. 3 and FIG. 4 comprise the smartcell system 111 and isolation resistance monitoring system 102 of FIG. 1, contactors 301-314 of FIG. 3, and smartcell battery pack 402, smartcell board 404, asynchronous motor (ASM) 406, high voltage bus 408, alternating current (AC) charging inlet 410, and DC charging inlet 411 of FIG. 4.

As discussed in one or more embodiments herein, the isolation resistance monitoring system 102 can be electrically integrated with the smartcell system 111 via switches S1 and S2 (also known as switches 107 and 108 per FIGS. 1 and 2), as well as via switches S3 and S4 (also known as switches 109 and 110 per FIGS. 3 and 4). The smartcell system topology comprises a smartcell battery pack 402 which can further comprise multiples of smartcell board 404. Each smartcell board 404 can control a battery module comprising one or more cells. A master node can control each smartcell board 404 and their respective battery modules such that the smartcell battery pack can produce different levels of AC output voltage at the pack level and it can produce different levels of DC output voltage at the pack or module level. In the smartcell topology, a battery module can output up to 14 volts (V), and the one or more battery modules can be combined in series such that each series combination can be arranged to form three parallel strings of the battery modules. Each string can also comprise a combination of battery modules configured to form a high voltage bus 408 that can produce a galvanically isolated output of 400V. The 14 V battery modules on each string form the low voltage side of the smartcell system, which can be galvanically isolated from the high voltage buses on each string.

Due to the nature of the smartcell topology in conjunction with the architecture of the isolation resistance monitoring system 102, the isolation resistance monitoring system 102 can be utilized for both AC and DC applications, for charging and non-charging use cases. The charging use cases can comprise DC charging of an electric vehicle via a high voltage EVSE system, during which the isolation resistance monitoring system can simultaneously monitor isolation resistance for the secondary circuit of the high voltage EVSE system and for the high voltage circuit of the smartcell system, including the high voltage buses and not including the low voltage, 14 V battery modules, by using switches S3 and S4. During DC charging, the isolated 400V bus, if alive, can also be monitored by using S1 and S2. Contactors 301, 302, 305, 306, 307, and 308 can be closed for DC charging. The charging use cases can further comprise AC charging of the electric vehicle, during which isolation resistance can be monitored for the high voltage circuit of the smartcell system, including the high voltage buses and not including the low voltage, 14 V battery modules, by using switches S1 and S2. Contactors 301, 302, 311, 312, 313, and 314 can be closed for AC charging. During either charging use case, the high voltage buses of the smartcell system can be energized to high voltage levels. Therefore, the solution can allow continuous isolation monitoring functionality for isolated high voltage buses with various voltage levels.

The non-charging use cases can comprise isolation resistance measurement, as part of an isolation test, to detect isolation fault prior to AC and/or DC charging, during short-term and long-term parking, before every start-up, during every power-down, and before and after every service action of the electric vehicle. For isolation resistance measurement during non-charging use cases, the high voltage buses of the smartcell system can be energized to safe voltage levels by the smartcell battery pack 402, wherein safe voltage levels can include voltage levels under 30 V for AC applications and voltage levels under 60 V for DC applications.

The isolation resistance monitoring system 102 can detect isolation fault in the smartcell system 111, wherein the fault can be in cable harnesses, busbars, fuses, and other high voltage components of the smartcell system 111. Energizing the high voltage buses to non-hazardous voltage levels, for isolation resistance measurement for detecting isolation fault, can further allow service technicians to troubleshoot isolation faults much easier. The fault detection sequence, which is described in greater detail in subsequent figures, can involve closing and opening several combinations of contactors 301 through 314 illustrated in the smartcell topology. This can facilitate isolation fault location in the smartcell system 111 prior to AC and/or DC charging, during short-term and long-term parking, before every start-up, during every power-down, before and after every service action, and before high voltage energization of the smartcell battery pack. The smartcell system 111 further comprises AC charging inlet 410 and DC charging inlet 411, and it is integrated with an asynchronous motor 406 (ASM 406). The ASM is also known as the electric front axle drive (EFAD) since it drives the front axle of the electric vehicle. The isolation resistance monitoring system can employ the isolation fault detection sequence such that depending on where an isolation fault is detected in the smartcell system, it can prevent AC charging, DC charging or front wheel drive of the vehicle, by opening the respective contactors to the AC charging inlet, DC charging inlet and the ASM, and it can prevent energization of the high voltage buses.

Figure 5:
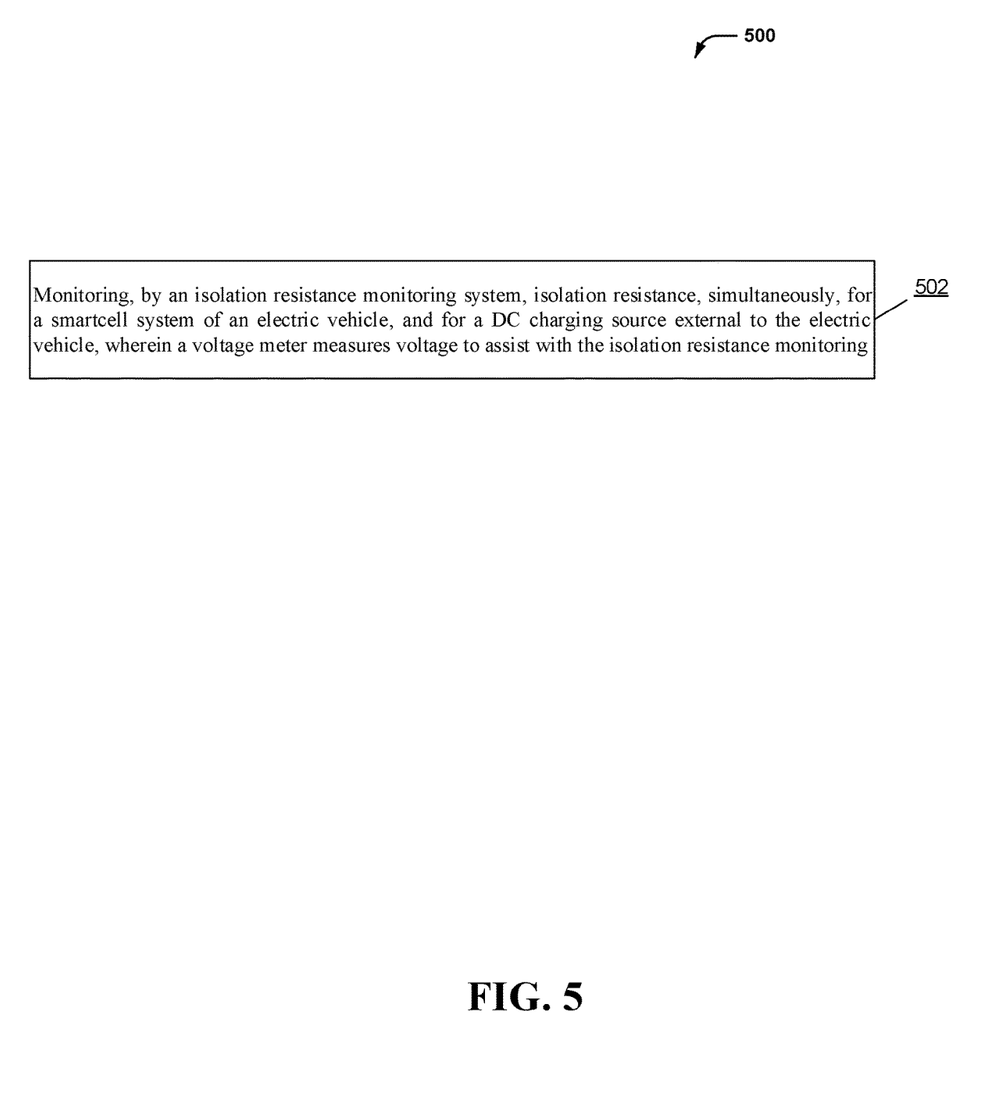
FIG. 5 illustrates an isolation resistance monitoring method that facilitates isolation resistance monitoring, in accordance with one or more embodiments described herein.

FIG. 5 illustrates an isolation resistance monitoring method that facilitates isolation resistance monitoring, in accordance with one or more embodiments described herein. Repetitive description of like elements and/or processes employed in respective embodiments is omitted for sake of brevity.

In an embodiment, environment 500 can comprise, at 502, an isolation resistance monitoring method which can facilitate monitoring, by an isolation resistance monitoring system, isolation resistance, simultaneously, for a smartcell system of an electric vehicle, and for a DC charging source external to the electric vehicle, wherein a voltage meter measures voltage to assist with the isolation resistance monitoring.

Figure 6:
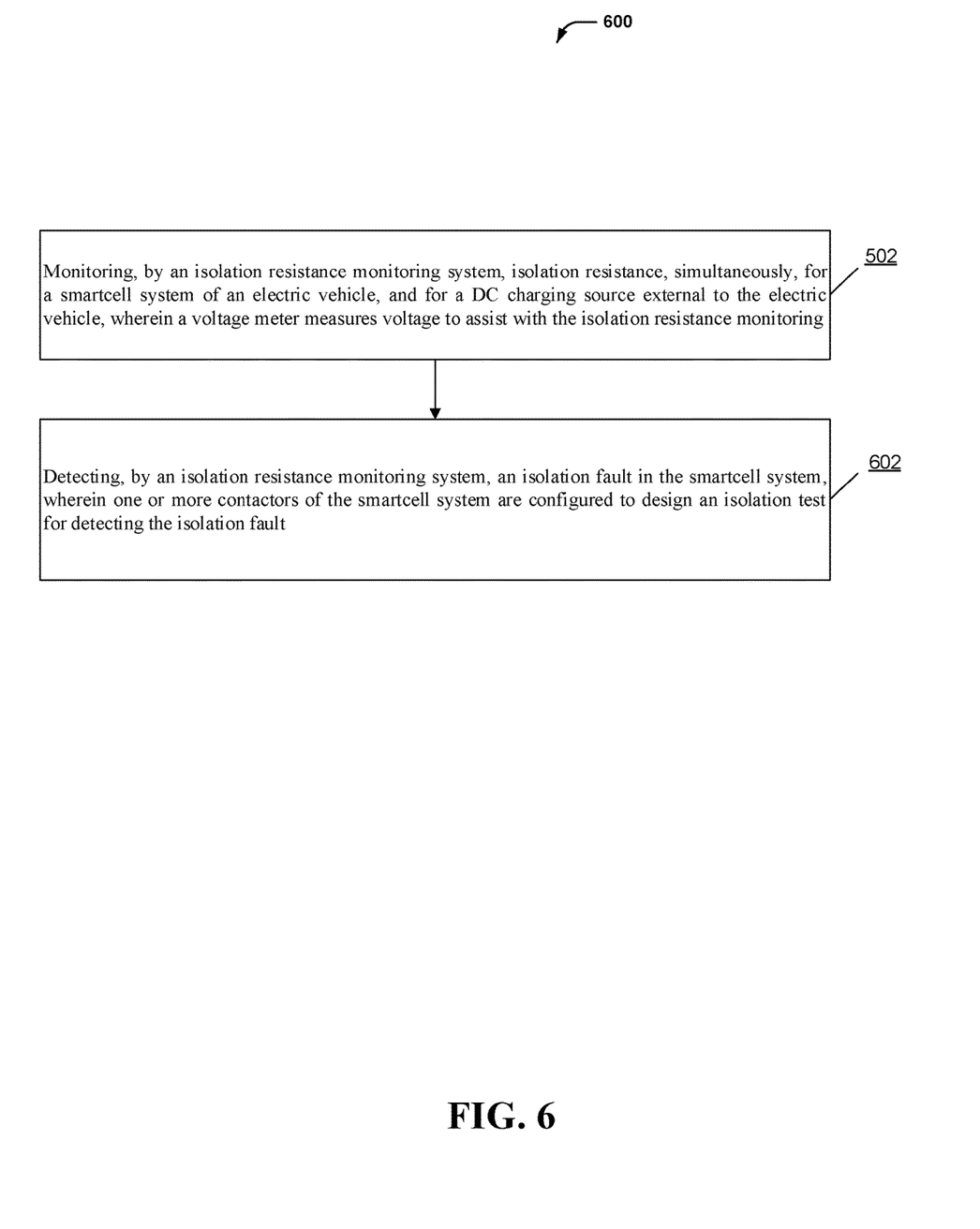
FIG. 6 illustrates a flow diagram of an isolation resistance monitoring method that facilitates isolation resistance monitoring and isolation fault detection, in accordance with one or more embodiments described herein.

FIG. 6 illustrates a flow diagram of an isolation resistance monitoring method that facilitates isolation resistance monitoring and isolation fault detection, in accordance with one or more embodiments described herein.

In an embodiment, environment 600 can comprise, at 502, an isolation resistance monitoring method which can facilitate monitoring, by an isolation resistance monitoring system, isolation resistance, simultaneously, for a smartcell system of an electric vehicle, and for a DC charging source external to the electric vehicle, wherein a voltage meter measures voltage to assist with the isolation resistance monitoring. At 602, the isolation resistance monitoring method can facilitate detecting, by an isolation resistance monitoring system, an isolation fault in the smartcell system, wherein one or more contactors of the smartcell system are configured to design an isolation test for detecting the isolation fault.

Figure 7:
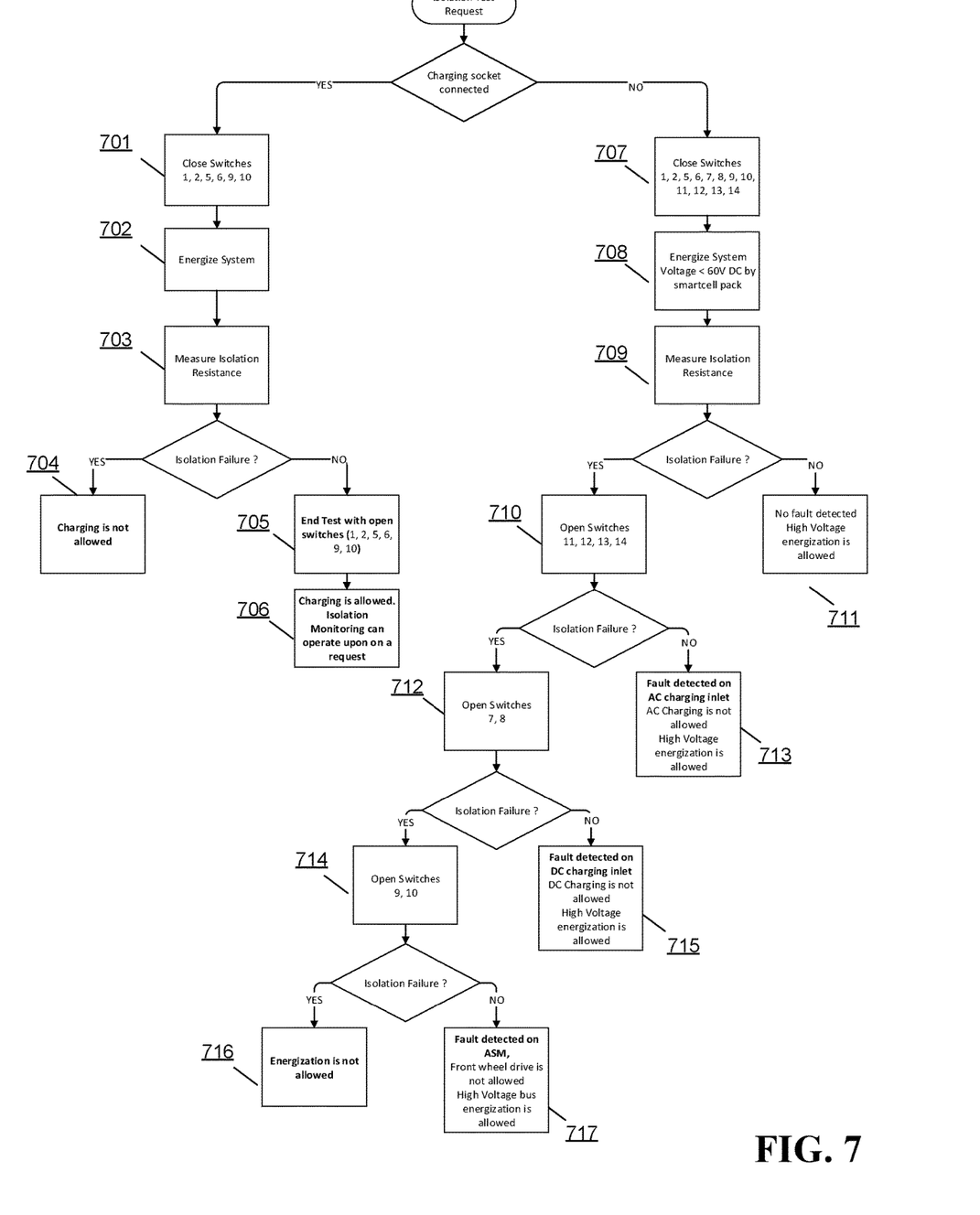
FIG. 7 illustrates a flow diagram of an isolation resistance monitoring method that facilitates isolation fault detection, in accordance with one or more embodiments described herein.

FIG. 7 illustrates a flow diagram of an isolation resistance monitoring method that facilitates isolation fault detection, in accordance with one or more embodiments described herein. Repetitive description of like elements and/or processes employed in respective embodiments is omitted for sake of brevity. FIG. 7 is to be understood in conjunction with FIGS. 3 and 4 where the smartcell system architecture is addressed.

In an embodiment, one or more contactors of a smartcell system can be configured to design an isolation test for detecting isolation fault, using the isolation resistance monitoring system, due to one or more components in the smartcell system. The isolation test can comprise two isolation test sequences, respectively, for a first and a second use case. The first use case comprises isolation fault detection in the smartcell system prior to AC charging and/or DC charging. The second use case comprises isolation fault detection in the smartcell system during short-term and long-term parking, before every start-up, during every power-down, and before and after every service action of an electric vehicle.

In FIG. 7, the first isolation test sequence is described by steps 701-706 which address the first use case comprising isolation fault detection in the smartcell system prior to AC charging and/or DC charging. Initially, all contactors can be in the open position. At 701, contactors 301, 302, 305, 306, 309, and 310 (as illustrated in FIG. 3) can be closed, and the system can be energized by the smartcell battery pack 402 to low DC voltage levels at 702, followed by isolation resistance measurement of the smartcell system 111 at 703. If an isolation failure is detected in the system, charging can be prevented at 704. If no isolation fault is detected, the test can be concluded by opening contactors 301, 302, 305, 306, 309, and 310, at 705, and the smartcell battery pack can be allowed to be charged either via an AC charging source or a DC charging source, at 706. Further isolation resistance monitoring of the smartcell system can operate upon a request.

The second isolation test sequence is described by steps 707-717 which address the second use case comprising isolation fault detection in the smartcell system 111 during short-term and long-term parking, before every start-up, during every power-down, and before and after every service action of an electric vehicle. Initially, all contactors can be in the open position. At 707, contactors 301, 302, 305, 306, 307, 308, 309, 310, 311, 312, 313, and 314 (as illustrated in FIG. 3) can be closed, and the system can be energized by the smartcell battery pack 402 to low DC voltage levels at 708.

At 709, the isolation resistance of the smartcell system 111 can be measured by the isolation resistance monitoring system 102. If no isolation faults can be detected, high voltage energization of the smartcell system 111 can be allowed at 711, and if an isolation fault can be detected, contactors 311, 312, 313 and 314 can be disconnected at 710.

If no isolation fault can be detected after step 710, it can imply that the fault exists within the onboard section of the AC charging bus, since contactors 311, 312, 313, and 314 can provide a connection between the smartcell system 111 and the AC charging inlet 410. Thus, AC charging can be prevented, and high voltage energization of the smartcell system can be allowed at 713. If an isolation fault can be detected after step 710, contactors 307 and 308 can be opened at 712.

If no isolation fault can be detected after step 712, it can imply that the fault exists within the onboard section of the DC charging bus, since contactors 307 and 308 can provide a connection between the smartcell system 111 and the DC charging inlet 411. Thus, DC charging can be prevented, and high voltage energization of the smartcell system can be allowed at 715. If an isolation fault can be detected after step 712, contactors 309 and 310 can be opened at 714.

If no isolation fault can be detected after step 714, it can imply that the fault exists with ASM 406, since contactors 309 and 310 can provide a connection between the smartcell system 111 and ASM 406. Thus, front wheel drive can be prevented, and high voltage energization of the smartcell system can be allowed at 717. If an isolation fault can be detected after step 714, high voltage energization can be prevented at 716, and the test can be concluded.

Thus, an isolation fault detection test can be performed upon a request, and the isolation test sequence can be executed at safe voltage levels by energizing the high voltage buses of the smartcell system accordingly. As discussed in one or more embodiments herein, the isolation fault detection test can detect isolation faults in the smartcell system, where in the faults can be caused in cable harness, busbars, fuses and other high voltage components of the smartcell system.

Further aspects of the invention are provided by the subject matter of the following clauses:

1. An isolation resistance monitoring system, comprising:
an electrical circuit, comprising:
one or more resistors; and
a voltage meter which measures voltage, such that the voltage measurement assists with monitoring isolation resistance, simultaneously, for a smartcell system of an electric vehicle, and for a direct current (DC) charging source external to the electric vehicle.

2. The system according to claim 1, wherein the DC charging source comprises a high voltage Electric Vehicle Supply Equipment (EVSE) system which is an external charging station for the electric vehicle.

3. The system according to claim 1, further comprising:
a first plurality of switches which electrically integrate the isolation monitoring system with the smartcell system of the electric vehicle; and
a second plurality of switches which electrically integrate the isolation monitoring system with the high voltage EVSE system.

4. The system according to claim 1, wherein the isolation resistance monitoring system monitors isolation resistance, simultaneously, for the high voltage EVSE system and for one or more high voltage buses of the smartcell system during DC charging.

5. The system according to claim 4, wherein the one or more high voltage buses of the smartcell system are energized to high voltage levels for the DC charging use case.

6. The system according to claim 4, wherein the one or more high voltage buses are energized to low voltage levels during non-charging use cases of the isolation resistance monitoring system.

7. The system according to claim 6, wherein the non-charging uses cases include isolation resistance measurement, as part of an isolation test, for detecting isolation fault in the smartcell system prior to AC and/or DC charging, during short-term and long-term parking, before every start-up, during every power-down, and before and after every service action of the electric vehicle, for AC and/or DC applications.

8. An isolation resistance monitoring method, comprising:
monitoring, by an isolation resistance monitoring system, isolation resistance, simultaneously, for a smartcell system of an electric vehicle, and for a DC charging source external to the electric vehicle, wherein a voltage meter measures voltage to assist with the isolation resistance monitoring.

9. The method according to claim 8, wherein the DC charging source comprises a high voltage Electric Vehicle Supply Equipment (EVSE) system which is an external charging station for the electric vehicle.

10. The system according to claim 8, further comprising:
integrating, by the system, the isolation monitoring system with the smartcell system of the electric vehicle using a first plurality of switches;
integrating, by the system, the isolation monitoring system with the high voltage EVSE system of the electric vehicle using a second plurality of switches; and
monitoring, by the system, isolation resistance, simultaneously, for the high voltage EVSE system and for one or more high voltage buses of the smartcell system during DC charging.

11. The system according to claim 10, wherein the one or more high voltage buses of the smartcell system are energized to high voltage levels for the DC charging use case; and wherein the one or more high voltage buses are energized to low voltage levels during non-charging use cases of the isolation resistance monitoring system.

12. The system according to claim 11, wherein the non-charging uses cases include isolation resistance measurement, as part of an isolation test, for detecting isolation fault in the smartcell system prior to AC and/or DC charging, during short-term and long-term parking, before every start-up, during every power-down, and before and after every service action of the electric vehicle, for AC and/or DC applications.

13. An isolation fault detection method, comprising:
detecting, by an isolation resistance monitoring system, an isolation fault in a smartcell system, wherein one or more contactors of the smartcell system are configured to design an isolation test for detecting the isolation fault.

14. The method according to claim 13, further comprising:
executing, by the system, a first isolation test sequence of the isolation test, for a first use case;
executing, by the system, the first isolation test sequence such that the isolation fault is located by energizing the smartcell system to low voltage levels;
detecting, by the system, the isolation fault for the first use case, wherein the first use case comprises isolation fault detection in the smartcell system prior to AC charging and/or DC charging;
executing, by the system, a second isolation test sequence of the isolation test, for a second use case;
executing, by the system, the second isolation test sequence such that the isolation fault is located by energizing the smartcell system to low voltage levels; and
detecting, by the system, the isolation fault for the second use case, wherein the second use case comprises isolation fault detection in the smartcell system during short-term and long-term parking, before every start-up, during every power-down, and before and after every service action of an electric vehicle.

15. The method according to claim 13, further comprising:
detecting, by the system, the isolation fault in the smartcell system, wherein the isolation fault detection method assists service technicians to troubleshoot isolation faults and assists with the drivability of an electric vehicle.

What is claimed:
1. An isolation resistance monitoring system, comprising:
an electrical circuit, comprising:
one or more resistors;
a voltage meter which measures voltage, such that the measured voltage assists with monitoring isolation resistance, simultaneously, between a battery system of an electric vehicle and an electrical chassis of the electric vehicle, and between a direct current (DC) charging source external to the electric vehicle and the electrical chassis, wherein the DC charging source comprises a high voltage Electric Vehicle Supply Equipment (EVSE) system which is an external charging station for the electric vehicle;
a first plurality of switches which selectively electrically couple the voltage meter with the battery system of the electric vehicle; and
a second plurality of switches which selectively electrically couple the voltage meter with the high voltage EVSE system.

2. The isolation resistance monitoring system of claim 1, wherein the isolation resistance monitoring system monitors the isolation resistance, simultaneously, for the high voltage EVSE system and for one or more high voltage buses of the battery system during DC charging.

3. The isolation resistance monitoring system of claim 2, wherein the one or more high voltage buses of the battery system are energized to high voltage levels during the DC charging.

4. The isolation resistance monitoring system of claim 2, wherein the one or more high voltage buses are energized to low voltage levels during non-charging of the battery system.

5. The isolation resistance monitoring system of claim 4, wherein the non-charging uses cases comprises isolation resistance measurement, as part of an isolation test, for detecting isolation fault in the battery system for at least one of prior to at least one of AC or DC charging, during short-term and long-term parking, before every start-up, during every power-down, or before and after every service action of the electric vehicle for at least one of AC or DC applications.

6. The isolation resistance monitoring system of claim 1, wherein the isolation resistance monitoring system detects an isolation fault in the battery system, and wherein one or more contactors of the battery system are employed for an isolation test for detecting the isolation fault.

7. The isolation resistance monitoring system of claim 6, wherein the isolation resistance monitoring system executes an isolation test sequence of the isolation test, and wherein the isolation fault is located by energizing the battery system to low voltage levels.

8. An isolation resistance monitoring method, comprising:
monitoring, by an isolation resistance monitoring system comprising a processor, isolation resistance, simultaneously, between a battery system of an electric vehicle and an electrical chassis of the electric vehicle, and between a direct current (DC) charging source external to the electric vehicle and the electrical chassis, wherein a voltage meter measures voltage to assist with the isolation resistance monitoring, and wherein the DC charging source comprises a high voltage Electric Vehicle Supply Equipment (EVSE) system which is an external charging station for the electric vehicle;
selectively electrically coupling, by the isolation resistance monitoring system, the voltage meter with the battery system of the electric vehicle using a first plurality of switches; and
selectively electrically coupling, by the isolation resistance monitoring system, the voltage meter with the high voltage EVSE system of the electric vehicle using a second plurality of switches.

9. The isolation resistance monitoring method of claim 8, wherein the monitoring comprises:
monitoring, by the isolation resistance monitoring system, the isolation resistance, simultaneously, for the high voltage EVSE system and for one or more high voltage buses of the battery system during DC charging.

10. The isolation resistance monitoring method of claim 9, wherein the one or more high voltage buses of the battery system are energized to high voltage levels during the DC charging.

11. The isolation resistance monitoring method of claim 9, wherein the one or more high voltage buses are energized to low voltage levels during non-charging of the battery system.

12. The isolation resistance monitoring method of claim 11, wherein the non-charging uses cases comprises isolation resistance measurement, as part of an isolation test, for detecting isolation fault in the battery system for at least one of prior to at least one of AC or DC charging, during short-term and long-term parking, before every start-up, during every power-down, or before and after every service action of the electric vehicle for at least one of AC or DC applications.

13. The isolation resistance monitoring method of claim 8, further comprising:
detecting, by the isolation resistance monitoring system, an isolation fault in the battery system, wherein one or more contactors of the battery system are employed for an isolation test for detecting the isolation fault.

14. The isolation resistance monitoring method of claim 13, further comprising:
executing, by the isolation resistance monitoring system, an isolation test sequence of the isolation test, wherein the isolation fault is located by energizing the battery system to low voltage levels.

15. The isolation resistance monitoring method of claim 14, wherein the detecting comprises isolation fault detection in the battery system prior to at least one of AC or DC charging.

16. The isolation resistance monitoring method of claim 14, wherein the detecting comprises isolation fault detection in the battery system for at least one of during short-term and long-term parking, before every start-up, during every power-down, or before and after every service action of the electric vehicle.

17. An electric vehicle comprising:
an isolation resistance monitoring system that:
monitors, using a voltage meter, isolation resistance, simultaneously, between a battery system of the electric vehicle and an electrical chassis of the electric vehicle, and between a direct current (DC) charging source external to the electric vehicle and the electrical chassis, wherein the voltage meter measures voltage to assist with the isolation resistance monitoring, and wherein the DC charging source comprises a high voltage Electric Vehicle Supply Equipment (EVSE) system which is an external charging station for the electric vehicle;
selectively electrically couples the voltage meter with the battery system of the electric vehicle using a first plurality of switches; and
selectively electrically couples the voltage meter with the high voltage EVSE system of the electric vehicle using a second plurality of switches.

18. The electric vehicle of claim 17, wherein the monitoring comprises:

monitoring the isolation resistance, simultaneously, for the high voltage EVSE system and for one or more high voltage buses of the battery system during DC charging.

19. The electric vehicle of claim 18, wherein the one or more high voltage buses of the battery system are energized to high voltage levels during the DC charging.

20. The electric vehicle of claim 18, wherein the one or more high voltage buses are energized to low voltage levels during non-charging of the battery system.

* * * * *